United States Patent
Lyu et al.

(10) Patent No.: US 9,478,444 B2
(45) Date of Patent: Oct. 25, 2016

(54) MECHANISMS FOR CLEANING WAFER AND SCRUBBER

(71) Applicant: TAIWAN SEMICONDUCTOR MANUFACTURING CO., LTD., Hsin-Chu (TW)

(72) Inventors: Tai-Liang Lyu, Zhubei (TW); Shao-Yen Ku, Jhubei (TW); Tzu-Yang Chung, Hsin-Chu (TW); Chia-Ming Tai, New Taipei (TW); Chao-Hui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 363 days.

(21) Appl. No.: 13/948,595

(22) Filed: Jul. 23, 2013

(65) Prior Publication Data
US 2015/0027489 A1    Jan. 29, 2015

(51) Int. Cl.
*B08B 3/12* (2006.01)
*H01L 21/67* (2006.01)

(52) U.S. Cl.
CPC ... *H01L 21/67051* (2013.01); *H01L 21/67046* (2013.01); *B08B 3/12* (2013.01)

(58) Field of Classification Search
CPC ......... B08B 3/12; B08B 3/102; B08B 3/104; B08B 3/123; B08B 3/044; H01L 21/67051; H01L 21/67046
See application file for complete search history.

(56) References Cited

U.S. PATENT DOCUMENTS

| | | | | |
|---|---|---|---|---|
| 6,254,688 B1* | 7/2001 | Kobayashi | ............... | B08B 1/04 134/1 |
| 6,423,146 B1* | 7/2002 | Fukazawa | ................ | B08B 3/02 134/2 |
| 2006/0213536 A1* | 9/2006 | Sato | .................. | H01L 21/67046 134/6 |
| 2008/0053487 A1* | 3/2008 | Goto | ................ | H01L 21/02057 134/32 |
| 2009/0025155 A1* | 1/2009 | Nishiyama | ........ | H01L 21/67046 15/21.1 |
| 2010/0126531 A1* | 5/2010 | Ku | ............................ | B08B 3/08 134/26 |

FOREIGN PATENT DOCUMENTS

JP    10137710 A  *  5/1998

OTHER PUBLICATIONS

Machine translation: JP 10-137710A; Kurokawaet al. (1998).*

* cited by examiner

*Primary Examiner* — Michael Kornakov
*Assistant Examiner* — Natasha Campbell
(74) *Attorney, Agent, or Firm* — Birch, Stewart, Kolasch & Birch, LLP

(57) ABSTRACT

Embodiments of mechanisms for cleaning a wafer are provided. A method for cleaning a wafer includes cleaning a wafer by using a wafer scrubber and cleaning the wafer scrubber in a scrubber cleaning module. An agitated cleaning liquid is applied on the wafer scrubber to clean the wafer scrubber. The method also includes cleaning the wafer or a second wafer by the wafer scrubber after the wafer scrubber is cleaned by the agitated cleaning liquid.

20 Claims, 14 Drawing Sheets

MECHANISMS FOR CLEANING WAFER AND SCRUBBER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

A critical condition in semiconductor manufacturing is the absence of contaminants on the wafer processing surface, since contaminants including, for example, microscopic particles, may interfere with and adversely affect subsequent processing steps leading to device degradation and ultimately semiconductor wafer rejection. While the wafer cleaning process has always been a critical step in the semiconductor wafer manufacturing process, ultra clean wafers are becoming even more critical to device integrity. For example, as semiconductor feature sizes decrease, the detrimental affect of particle contaminant increases, requiring removal of ever smaller particles. Further, as the number of device layers increase, there is a corresponding increase in the number of cleaning steps and the potential for device degradation caused by particulate contaminant. To adequately meet requirements for ultra clean wafers in ULSI and VLSI, the wafer surface needs to be essentially free of contaminating particles.

It is desired to have methods and system for cleaning wafers to reduce contaminants or particles on the wafers.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Throughout the various views and illustrative embodiments, like reference numbers are used to designate like elements.

Figure 1A:
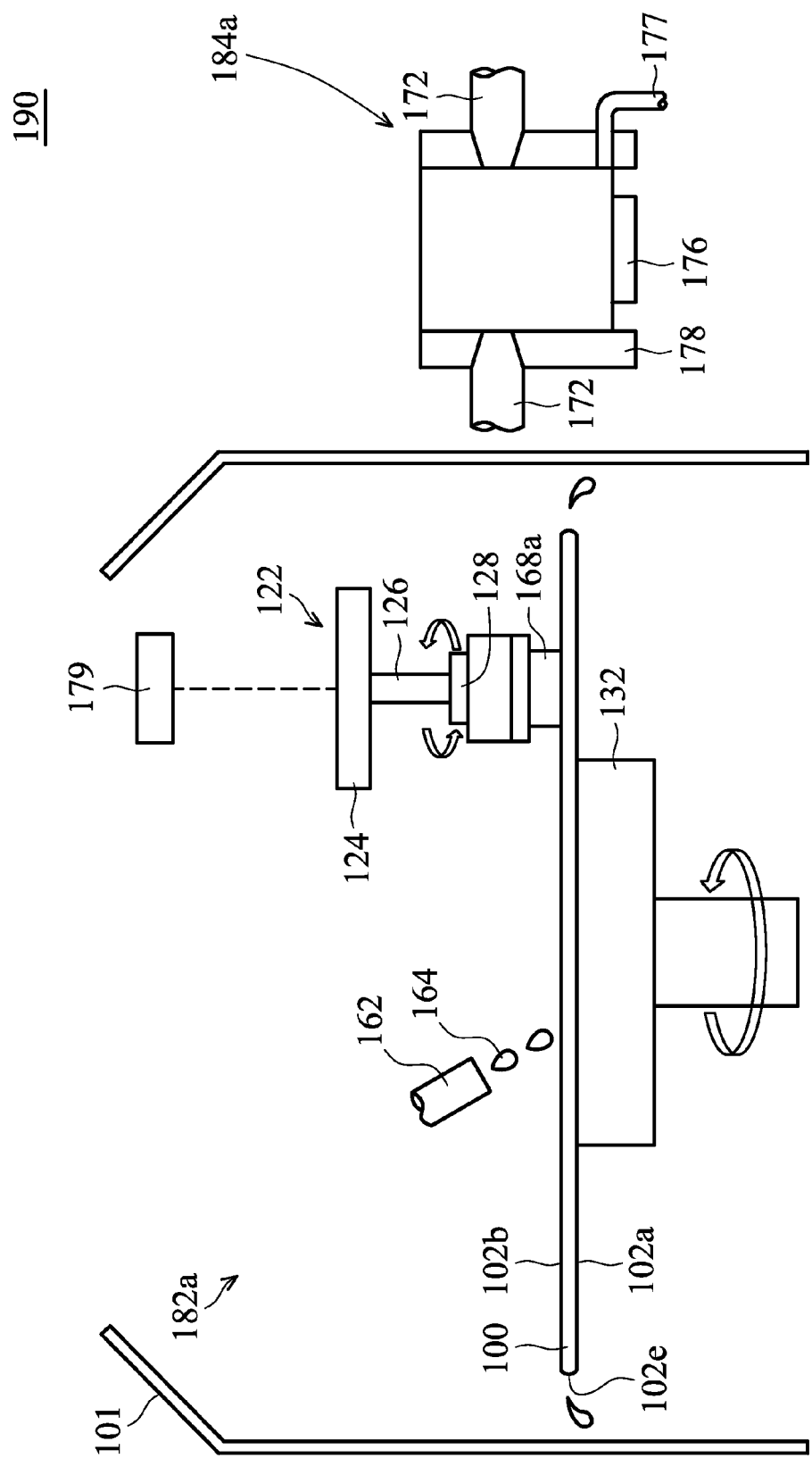
FIGS. 1A and 1B are cross-sectional views of stages of a process for cleaning a wafer in a cleaning system, in accordance with some embodiments.
Figure 1B:
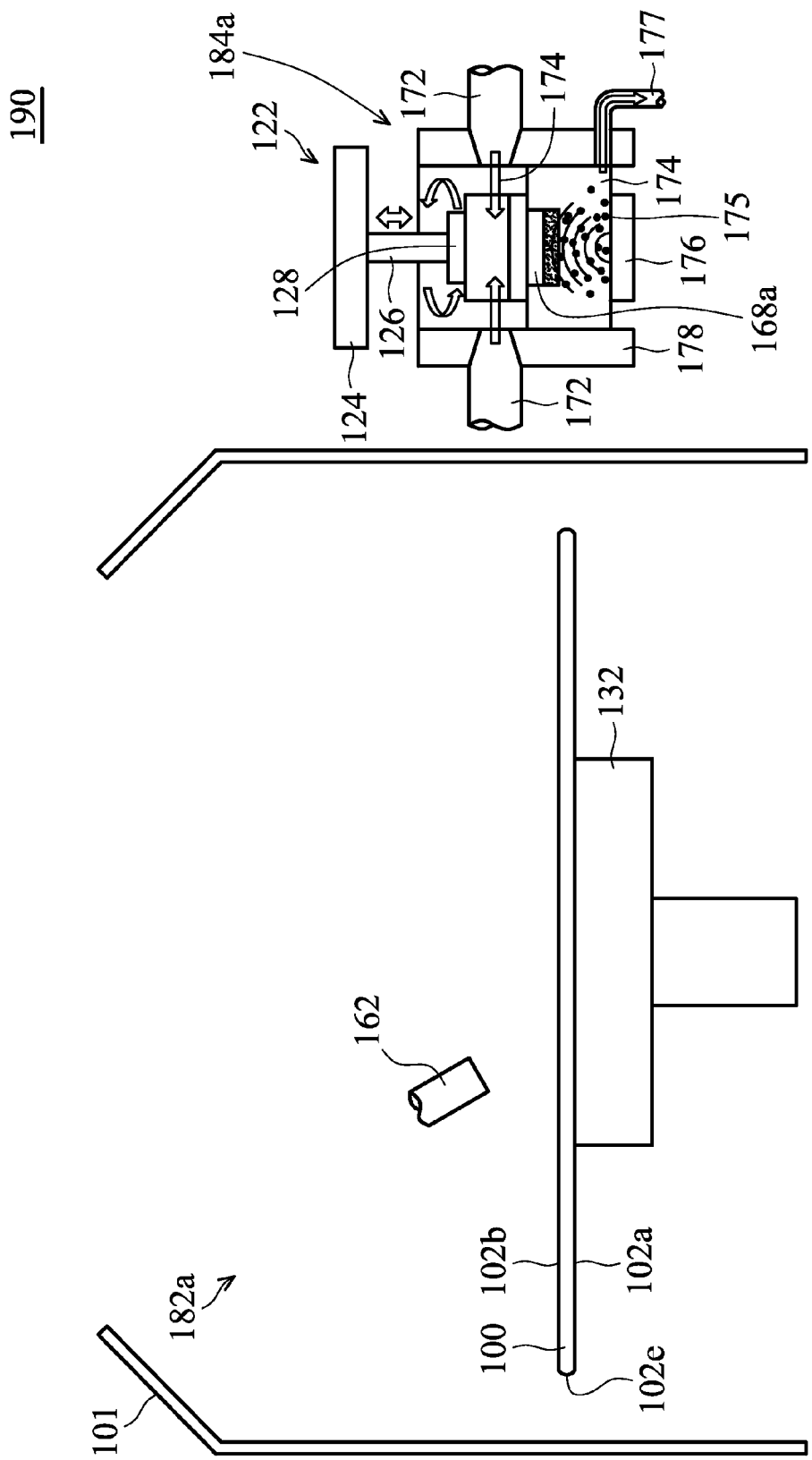

FIGS. 1A and 1B are cross-sectional views of stages of a process for cleaning a wafer in a cleaning system 190, in accordance with some embodiments. Cleaning system 190 includes a wafer cleaning module 182a and a scrubber cleaning module 184a. Wafer cleaning module is configured to clean a wafer, such as a wafer 100. Wafer 100 may be a semiconductor wafer having integrated circuits, a semiconductor wafer having no integrated circuit (blank semiconductor wafer), a glass wafer, other similar substrates, or the like. Cleaning system 190 may include a chamber 101. Chamber 101 contains wafer cleaning module 182a.

As shown in FIG. 1A, wafer cleaning module 182a includes a wafer holder 132, a scrubber assembly 122, and a cleaning liquid provider 162, in accordance with some embodiments. Wafer holder 132 is configured to hold and secure wafer 100 which is to be cleaned. Wafer holder 132 may include a vacuum holder, a mechanical chunk, or another applicable holder. Wafer holder 132 is rotatable in a horizontal plane.

As shown in FIG. 1A, scrubber assembly 122 includes a robot arm 124, a shaft 126, a brush holder 128, and a scrubber (wafer scrubber) 168a, in accordance with some embodiments. Scrubber (or brush) 168a is supported on the distal end of shaft 126 connected to robot arm 124 by brush holder 128. Shaft 126 is rotatable such that brush holder 128 and scrubber 168a may be rotated if needed. Robot arm 124 is vertically and horizontally movable. Therefore, scrubber 168a is capable of being transferred between wafer cleaning module 182a and scrubber cleaning module 184a.

Cleaning liquid provider 162 is configured to dispense a cleaning liquid 164 onto wafer 100. Cleaning liquid 164 may include deionized water and/or another applicable cleaning liquid. Cleaning liquid provider 162 may be a nozzle, which is configured to eject or drop cleaning liquid 164 onto wafer 100.

Wafer 100 has a front side surface 102a, a back side surface 102b, and a wafer edge 102e. In some embodiments, wafer 100 is moved to be placed on wafer holder 132 and secured to wafer holder 132 with the surface to be cleaned facing upward. In some embodiments, back side surface 102b faces upward and is to be cleaned. In some embodiments, back side surface 102b is cleaned before wafer edge 102e, and wafer edge 102e is cleaned before front side surface 102a is cleaned.

In some embodiments, scrubber assembly 122 is lowered to bring scrubber 168a into contact with back side surface 102b of wafer 100. Wafer 100 is also rotated by wafer holder 132 and rinsed by cleaning liquid 164. Scrubber 168a is suitable for removing particles and/or contaminants from wafer 100, which is rinsed by cleaning liquid 164. Scrubber 168a may be made of a suitable polymer material, such as a polyurethane (PU) based sponge, polyvinyl alcohol (PVA) based sponge, another applicable material, or combinations thereof. Due to the polishing of scrubber 168a, back side surface 102b of wafer 100 is cleaned. Cleaning liquid 164 also helps the removal of particles and/or contaminants from wafer 100. In some embodiments, before scrubber 168a is almost in direct contact with wafer 100, rotation of scrubber 168a is started by shaft 126. In some other embodiments, scrubber 168a is not rotated.

In some embodiments, scrubber 168a is gradually moved inward from an edge to a center of wafer 100. Alternatively, scrubber 168a is gradually moved outward from the center to the edge of wafer 100. Because wafer 100 is rotated, back side surface 102b is entirely rubbed by scrubber 168a. As a result, particles and/or contaminants on wafer 100 are removed by scrubber 168a such that back side surface 102b is cleaned.

Figure 2A:
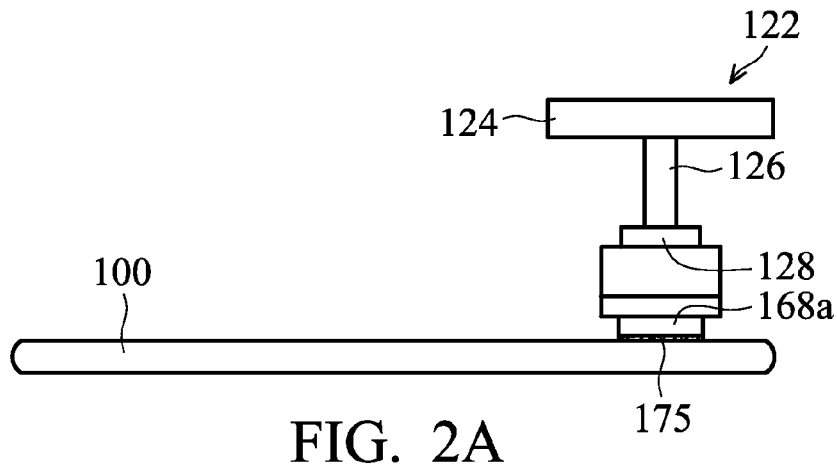
FIGS. 2A-2C are cross-sectional views of a scrubber after being used to clean different wafers, in accordance with some embodiments.
Figure 2B:
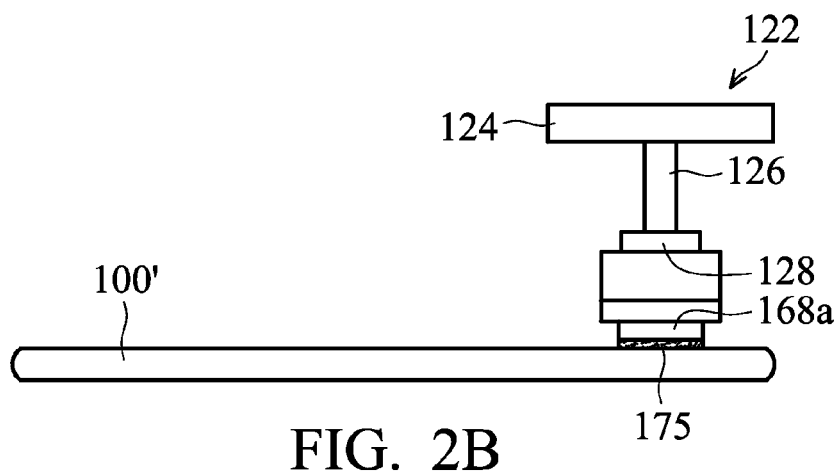
Figure 2C:
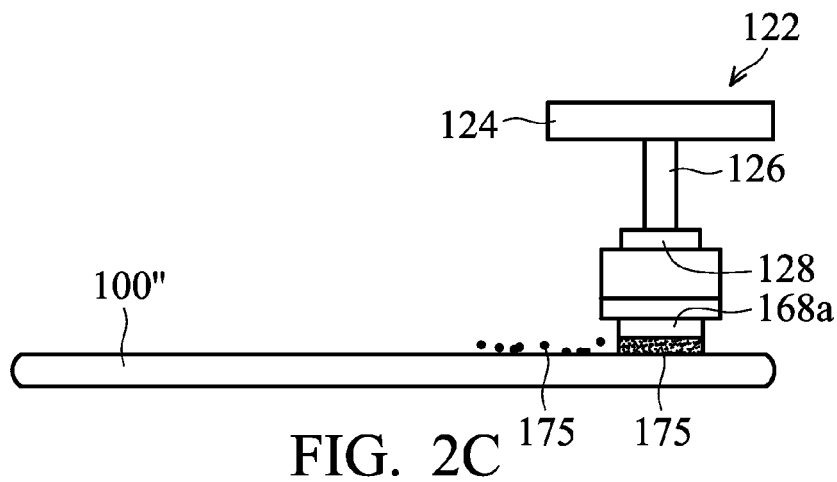

However, when scrubber 168a is used to clean wafers for a while, the cleaning efficiency would be reduced due to particle (contaminant) accumulation on scrubber 168a. FIGS. 2A-2C are cross-sectional views of scrubber 168a after being used to clean different wafers, in accordance with some embodiments.

As shown in FIG. 2A, after wafer 100 is cleaned by using scrubber 168a, contaminating particles 175 (or contaminants) accumulate on scrubber 168a. As shown in FIG. 2B, after scrubber 168a is further used to clean more wafers including a wafer 100', more contaminating particles 175 accumulate on scrubber 168a. As scrubber 168a is continually used for cleaning wafers, more and more contaminating particles 175 may adhere on scrubber 168a and contaminate scrubber 168a. Therefore, when scrubber 168a is used to clean a new wafer, some of the particulate contaminants may fall on the new wafer, degrading the cleaning effect of scrubber 168a.

For example, as shown in FIG. 2C, after scrubber 168a continues to be used to clean even more wafers including a wafer 100", even more contaminating particles 175 accumulate on scrubber 168a. In some embodiments, some of contaminating particles 175 are fallen from scrubber 168a and left on wafer 100". As a result, wafer 100" is not sufficiently cleaned, which will lead to a yield reduction of wafer 100".

In order to prevent the problems mentioned above, a new scrubber may be used to replace scrubber 168a which accumulates too many contaminating particles 175. However, replacing scrubber 168a with the new scrubber requires cleaning system 190 to be shut off. The processing capability of cleaning system 190 is lowered. Fabrication cost and time are increased.

Therefore, new mechanisms, other than replacing scrubber 168a with a new scrubber, are desired. To reduce and/or resolve the problems mentioned above, scrubber 168a is moved into scrubber cleaning module 184a to be cleaned, as shown in FIG. 1B. Because cleaning system 190 is not shut off for replacing a new scrubber, fabrication cost and time are reduced.

Scrubber cleaning module 184a includes elements which are configured to clean scrubber 168a. Scrubber 168a can be cleaned in scrubber cleaning module 184a by using an agitated cleaning liquid before being used to clean wafer 100. Wafer 100 is thus cleaned by scrubber 168a which has a clean condition. Therefore, wafer 100 is cleaned with high particulate contaminant removal efficiency since scrubber 168a is kept clean.

As shown in FIG. 1A, scrubber cleaning module 184a includes a cleaning liquid supply 172 and an agitation generator 176, in accordance with some embodiments. As shown in FIG. 1B, scrubber 168a is moved into scrubber cleaning module 184a to be cleaned. Cleaning liquid supply 172 is configured to provide or eject cleaning liquid 174 on scrubber 168a. Agitation generator 176 is configured to provide agitation energy to cleaning liquid 174. Scrubber cleaning module 184a may also include a container 178. Container 178 is configured to carry cleaning liquid 174 which is provided or ejected by cleaning liquid supply 172. Cleaning liquid 174 may include deionized water, $NH_4OH$ solution, $H_2O_2$ solution, HCl solution, or combinations thereof. Therefore, scrubber 168a, which accumulates contaminating particles 175, is cleaned by cleaning liquid 174, which is agitated by agitation generator 176. As a result, contaminating particles 175 are removed from scrubber 168a, as shown in FIG. 1B.

In some embodiments, agitation generator 176 is configured to vibrate container 178 such that cleaning liquid 174 is also agitated. In some embodiments, cleaning liquid 174 is ultrasonically agitated by agitation generator 176. Agitation generator 176 is capable of agitating cleaning liquid 174 at a frequency in a range from about 20 KHz to about 800 MHz. In some embodiments, the operation time for cleaning scrubber 168a is in a range from about 3 seconds to about 5 minutes.

In some embodiments, scrubber assembly 122 is lowered to dip scrubber 168a into cleaning liquid 174 which is ultrasonically agitated. Due to the ultrasonic agitation of cleaning liquid 174, contaminating particles 175 adhered on scrubber 168a is shaken away from scrubber 168a and dispersed in cleaning liquid 174. In some embodiments, cleaning liquid 174 dispersed with contaminating particles 175 is drained away through a drain 177 formed on a sidewall or a bottom of container 178. Cleaning liquid supply 172 continually provides cleaning liquid 174, and cleaning liquid 174 is continually agitated by agitation generator 176. As a result, scrubber 168a is cleaned and is ready for being used to clean wafers again.

As shown in FIG. 1B, scrubber 168a is rotated by shaft 126 in cleaning liquid 174, in accordance with some embodiments. Together with the rotation of scrubber 168a, cleaning liquid 174 is agitated by agitation generator 176. That is, scrubber 168a is rotated in agitated cleaning liquid 174. The removal of contaminating particles 175 adhered on scrubber 168a is greatly enhanced.

In some embodiments, scrubber 168a is shaken in cleaning liquid 174 by repeatedly raising and lowering scrubber assembly 122 during cleaning liquid 174 is agitated by agitation generator 176. Therefore, the removal of particulate contaminants is improved. In some embodiments, scrubber 168a is simultaneously rotated and shaken in agitated cleaning liquid 174.

Figure 3A:
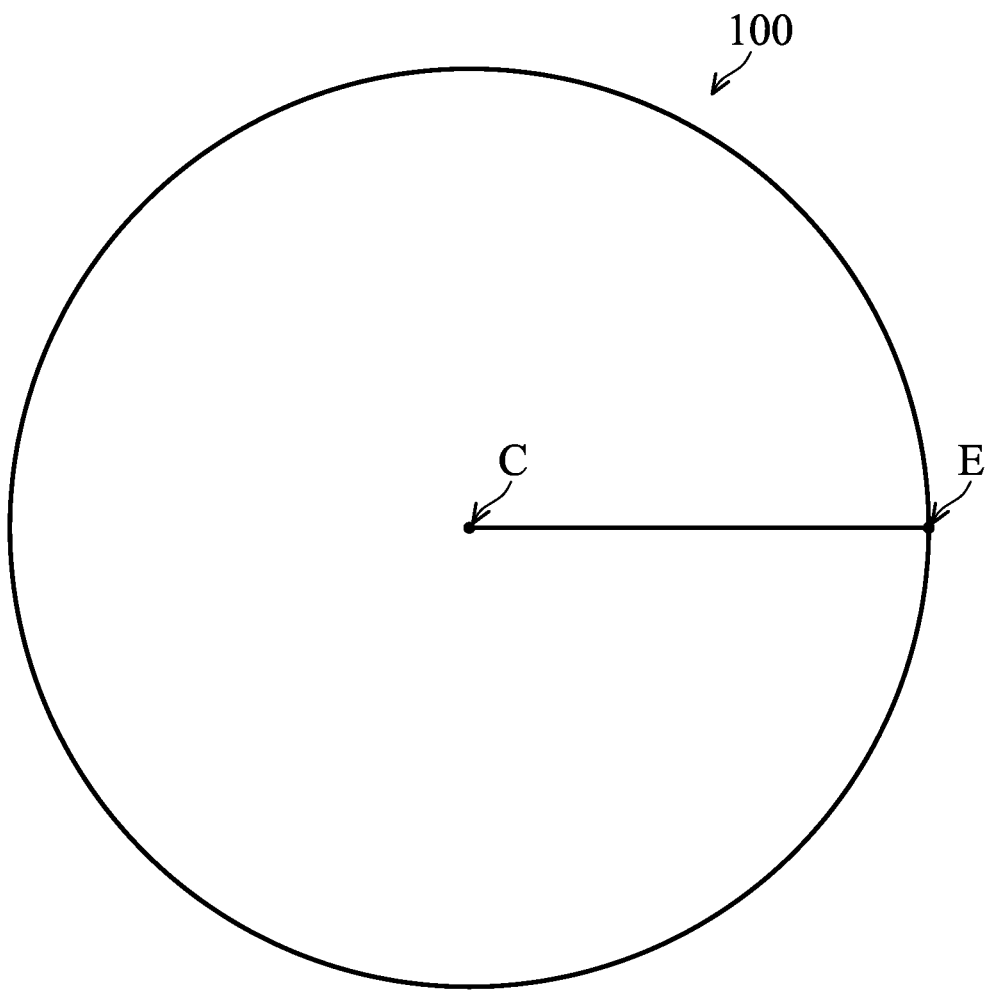
FIG. 3A is a top view of a wafer being cleaned, in accordance with some embodiments.

Wafer 100 may be cleaned by scrubber 168a, which is cleaned, in a variety of methods. FIG. 3A is a top view of a wafer being cleaned, in accordance with some embodiments. As shown in FIGS. 1A and 3A, scrubber 168a, which have been cleaned in scrubber cleaning module 184a, is moved to contact with a center position C of wafer 100, in accordance with some embodiments. Afterwards, scrubber assembly 122 moves laterally and gradually from center position C to an edge position E of wafer 100 to clean wafer 100. Because wafer 100 is rotated, the entire surface (such as back side surface 102b) of wafer 100 is cleaned after scrubber assembly 122 is moved outwardly from center position C to edge position E. In some other embodiments, scrubber assembly 122 moves laterally and gradually from edge position E to center position C of wafer 100 to clean wafer 100.

As shown in FIG. 1A, cleaning liquid provider 162 provides cleaning liquid 164 on wafer 100 during the cleaning operation. When cleaned scrubber 168a touches wafer 100, which is rotating, particles on wafer 100 are removed by scrubber 168a and cleaning liquid 164.

Figure 4A:
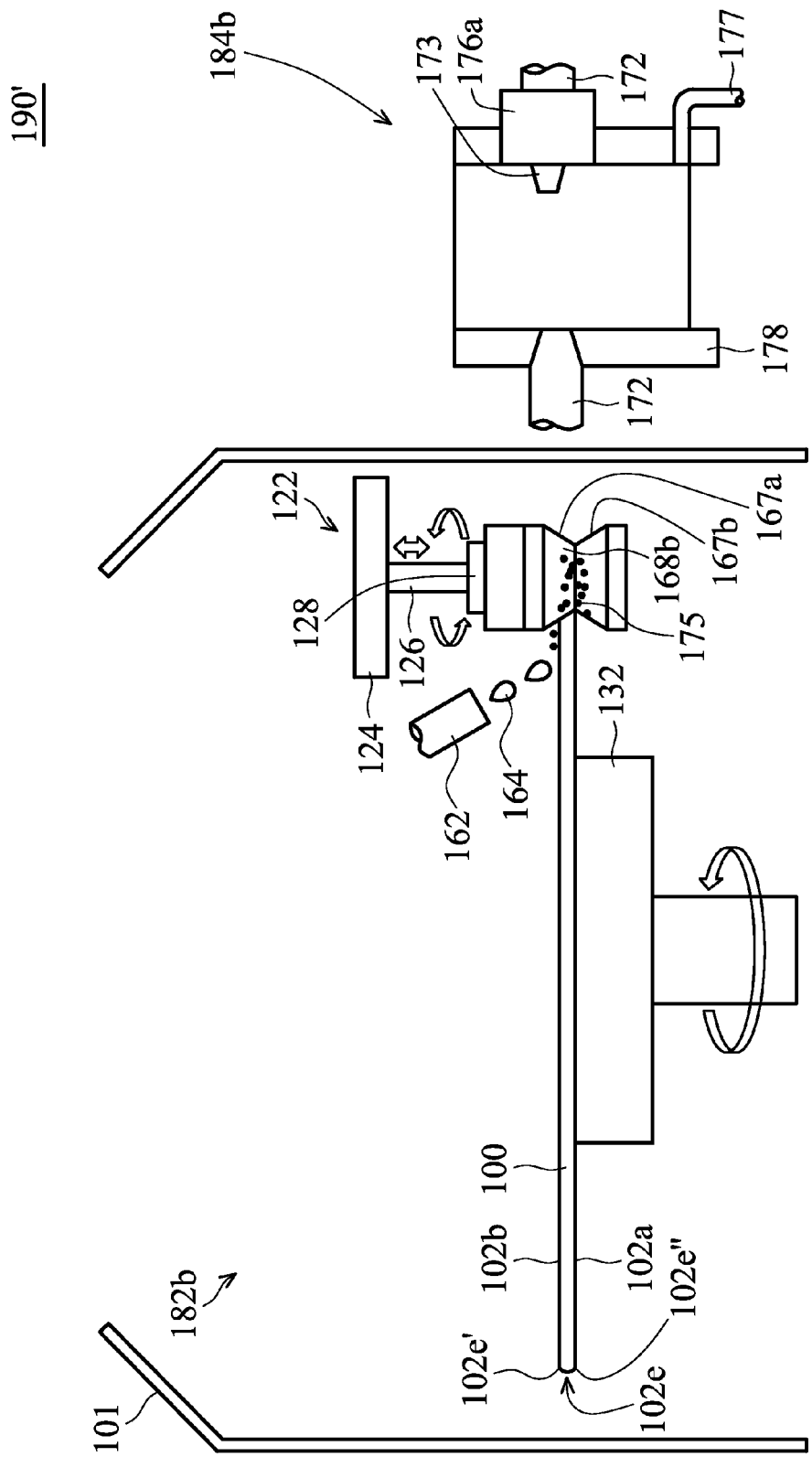
FIGS. 4A and 4B are cross-sectional views of stages of a process for cleaning a wafer in a cleaning system, in accordance with some embodiments.
Figure 4B:
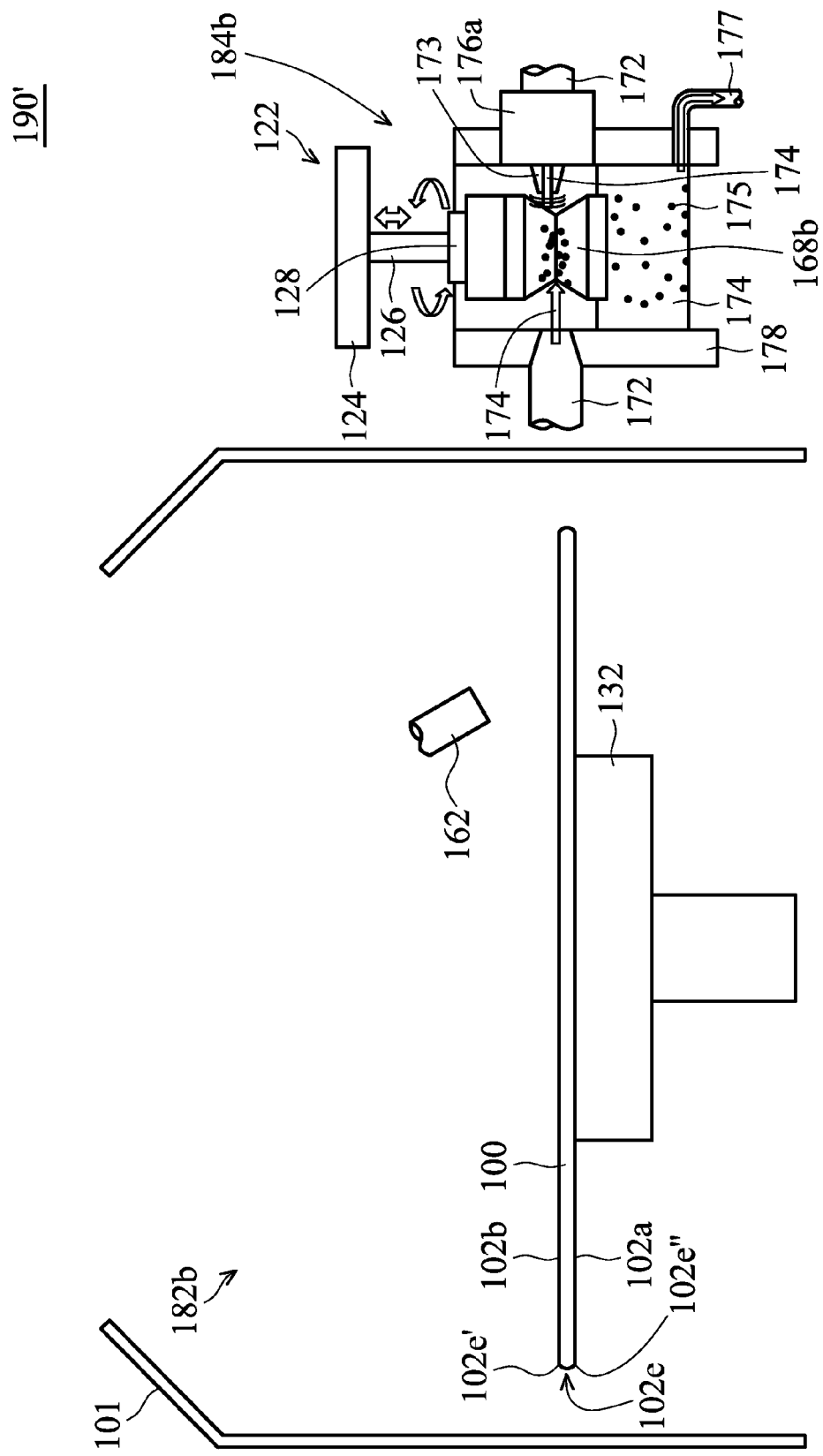

In some embodiments, wafer edge 102e of wafer 100 also needs to be cleaned. FIGS. 4A and 4B are cross-sectional views of stages of a process for cleaning a wafer in a cleaning system 190', in accordance with some embodiments. Cleaning system 190' includes a wafer cleaning module 182b and a scrubber cleaning module 184b. Scrubber assembly 122 includes a scrubber 168b secured to brush holder 128. Scrubber 168b is used to clean wafer edge 102e of wafer 100. Therefore, scrubber 168b is also called a bevel brush or bevel scrubber. Scrubber 168b may be made of a suitable polymer material, such as polyurethane (PU) based sponge, polyvinyl alcohol (PVA) based sponge, another applicable material, or combinations thereof.

As shown in FIG. 4A, scrubber 168b is moved to be in direct contact with wafer edge 102e of wafer 100 to clean wafer edge 102e, in accordance with some embodiments. Scrubber 168b may be rotated if needed. In some embodiments, cleaning liquid 164 is simultaneously provided onto back side surface 102b of wafer 100 by cleaning liquid provider 162 when wafer 100 is rotated. Cleaning liquid 164 flows to wafer edge 102e of wafer 100 to assist in the cleaning of wafer edge 102e.

Figure 5A:
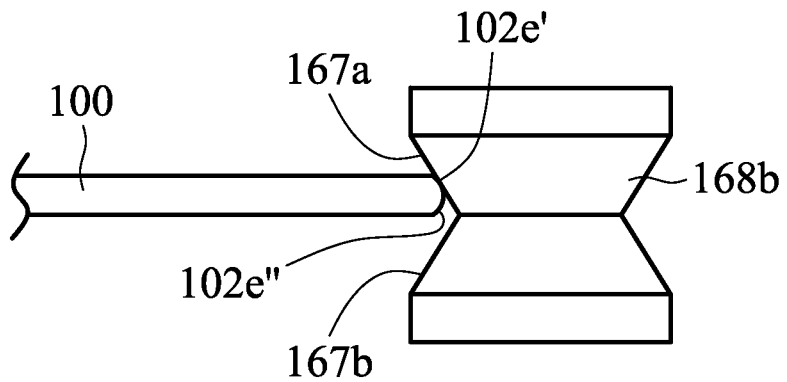
FIGS. 5A-5B are enlarged cross-sectional views of a process for cleaning a wafer edge of a wafer, in accordance with some embodiments.
Figure 5B:
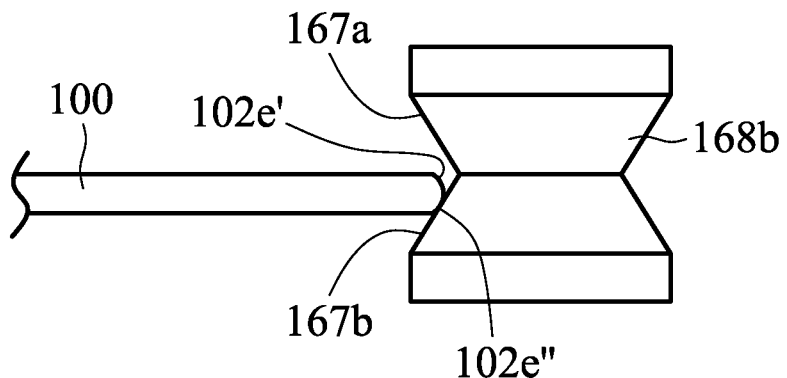

Wafer edge 102e includes an upper portion 102e' and a lower portion 102e". In some embodiments, scrubber 168b has sloping sidewall surfaces 167a and 167b, which are used to clean upper portion 102e' and lower portion 102e", respectively. FIGS. 5A-5B are enlarged cross-sectional views of a process for cleaning a wafer edge of a wafer, in accordance with some embodiments.

As shown in FIG. 5A, upper portion 102e' is scrubbed by sloping sidewall surface 167a of scrubber 168b, in accordance with some embodiments. Afterwards, as shown in FIG. 5B, scrubber 168b is lifted such that sloping sidewall surface 167b of scrubber 168b contacts with and clean lower portion 102e", in accordance with some embodiments. Since wafer 100 is rotated, wafer edge of wafer 100 as a whole is scrubbed and cleaned by scrubber 168b. In some other embodiments, lower portion 102e" is cleaned by scrubber 168b before upper portion 102e'.

When scrubber 168b touches wafer 100, which is rotating, contaminating particles 175 on wafer edge 102e are removed from wafer 100 by scrubber 168b and cleaning liquid 164. Some of contaminating particles 175 are adhered onto scrubber 168b. As scrubber 168b continues to be used for cleaning wafer 100, more and more contaminating particles 175 may adhere onto scrubber 168b. Therefore, when scrubber 168b is used to clean a new wafer, some of contaminating particles 175 may fall on the new wafer, degrading the cleaning effect of scrubber 168b. As a result, the new wafer is not sufficiently cleaned, which leads to a yield reduction.

Although a new scrubber may be used to replace scrubber 168b when it is contaminated, replacing scrubber 168b with the new scrubber requires cleaning system 190' to be shut off. The processing capability of cleaning system 190' would be lowered. Fabrication cost and time would increase.

To reduce and/or resolve the problems mentioned above, scrubber 168b, which is used to clean wafer 100, is moved into scrubber cleaning module 184b to be cleaned. As shown in FIG. 4A, scrubber cleaning module 184b is similar to scrubber cleaning module 184a as shown in FIGS. 1A and 1B. Different from scrubber cleaning module 184a, scrubber cleaning module 184b includes an agitation generator 176a adjacent to cleaning liquid supply 172.

As shown in FIG. 4B, agitation generator 176a is configured to vibrate a nozzle 173 of cleaning liquid supply 172, in accordance with some embodiments. Therefore, cleaning liquid 174 ejected from nozzle 173 is also agitated. In some embodiments, cleaning liquid 174 is ultrasonically agitated by agitation generator 176a. Agitation generator 176a is capable of agitating cleaning liquid 174 at a frequency in a range from about 20 KHz to about 800 MHz. In some embodiments, the operation time of cleaning scrubber 168b is in a range from about 3 seconds to about 5 minutes.

As shown in FIG. 4B, scrubber assembly 122 is lowered to a level such that scrubber 168b is ejected by cleaning liquid 174, in accordance with some embodiments. Due to the ultrasonic agitation of cleaning liquid 174, contaminating particles 175 adhered on scrubber 168b is removed away from scrubber 168b and dispersed in cleaning liquid 174. In some embodiments, cleaning liquid 174 dispersed with contaminating particles 175 is drained away through a drain 177 formed on a sidewall or a bottom of container 178. After scrubber 168b is cleaned, scrubber 168b may be moved back to wafer cleaning module 182b to clean wafers.

In some embodiments, scrubber 168b is rotated by shaft 126 during the ejection of cleaning liquid 174. Because cleaning liquid 174 ejected is agitated by agitation generator 176a and scrubber 168b itself is rotating, the removal of contaminating particles 175 is enhanced. In some embodiments, scrubber 168b is shaken by repeatedly raising and lowering scrubber 168b during the ejection of agitated cleaning liquid 174. The removal of contaminating particles 175 is improved. In some embodiments, scrubber 168b is simultaneously rotated and shaken when scrubber 168b is ejected by agitated cleaning liquid 174.

Figure 6A:
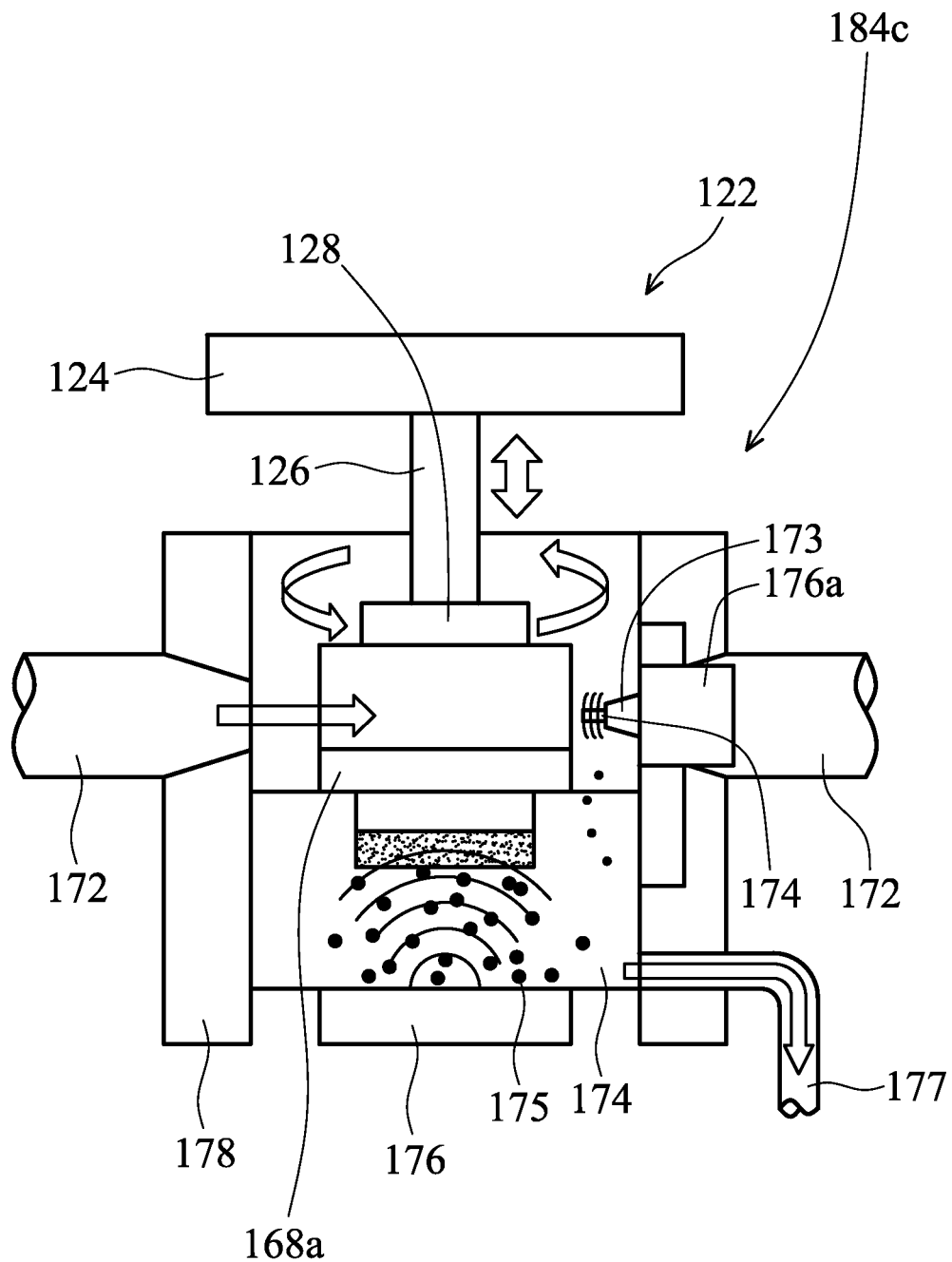
FIGS. 6A-6C are cross-sectional views of scrubber cleaning modules, in accordance with some embodiments.

FIG. 6A is a cross-sectional view of a scrubber cleaning module 184c, in accordance with some embodiments. As shown in FIG. 6A, scrubber cleaning module 184c includes both agitation generators 176 and 176a. Therefore, the cleaning efficiency of a scrubber 168a is improved. Scrubber cleaning module 184c may also be used to clean scrubber 168b, such as that shown in FIG. 6B. Scrubber cleaning module 184c may be used to clean different types of scrubbers.

Figure 6B:
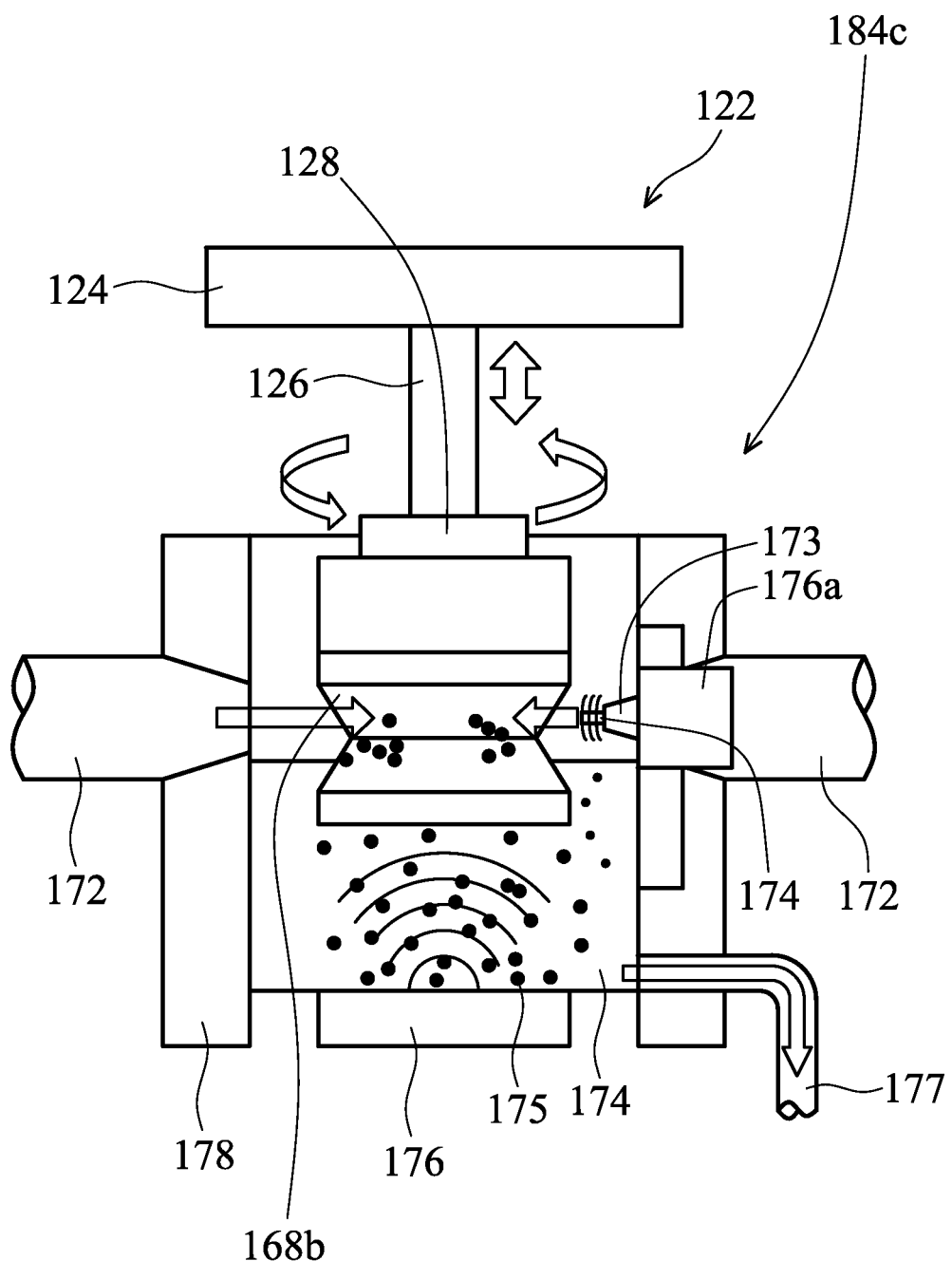
Figure 6C:
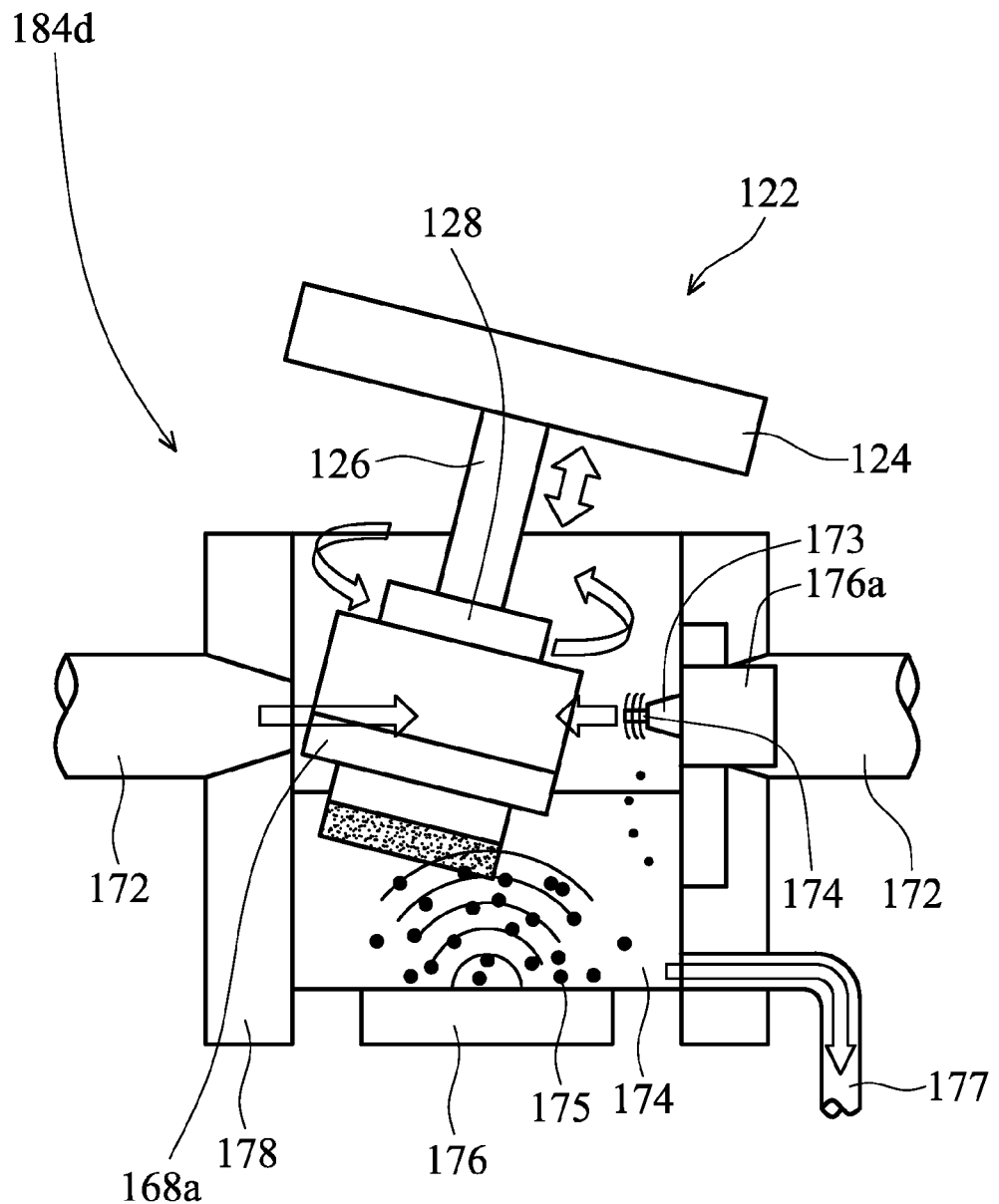

FIG. 6C is a cross-sectional view of a scrubber cleaning module 184d, in accordance with some embodiments. Cleaning liquid 174 may be agitated by agitation generator 176. Cleaning liquid 174 may be agitated by agitation generator 176a. Alternatively, both agitation generators 176 and 176a are used to provide agitation energy to cleaning liquid 176.

In some embodiments, a scrubber, such as scrubber 168a, is swung in cleaning liquid 174 which is agitated. Scrubber 168a may be swung at an angle in a range from about 30 degrees to about 90 degrees. The removal of contaminating particles 175 adhered on scrubber 168a is enhanced due to the swinging of scrubber 168a and the agitation of cleaning liquid 174. In some embodiments, scrubber 168a is rotated, swung, and/or shaken in cleaning liquid 174 which is ultrasonically agitated. Scrubber 168a is efficiently cleaned, and ready for use to clean wafers.

Embodiments of the disclosure provide methods for cleaning one or more wafers in a cleaning system including a scrubber cleaning module. The methods have many variations. Afterwards, some variations are described in more detail.

Figure 7A:
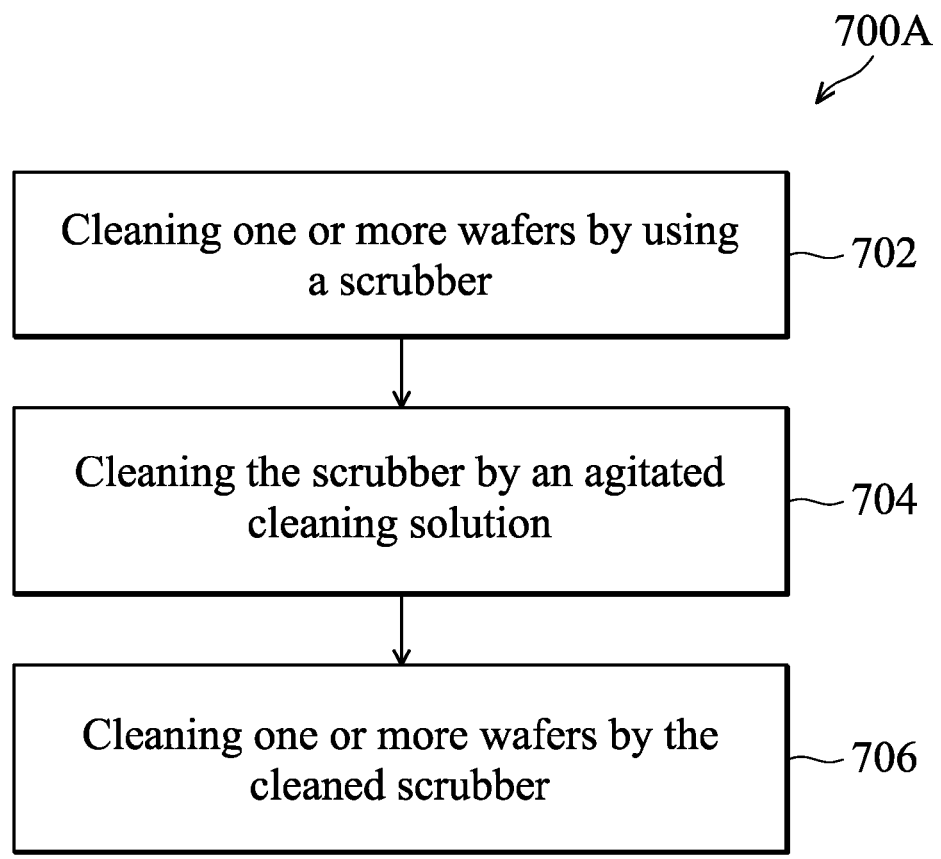
FIGS. 7A-7C are flow charts of methods for cleaning a wafer, in accordance with some embodiments.

FIG. 7A is a flow chart illustrating a method 700A for cleaning a wafer, in accordance with some embodiments. Method 700A begins with an operation 702 in which one (or more) wafer (such as wafer 100) is cleaned by using a scrubber, such as scrubber 168a shown in FIGS. 1A and 1B. In some other embodiments, wafer is cleaned by using scrubber 168b as shown in FIG. 4A, 4B, or 6B. After one or more wafers are cleaned by scrubber 168a or 168b, particles accumulate on scrubber 168a and 168b. As mentioned above, scrubber 168a or 168b needs to be cleaned for subsequent use.

Method 700A continues with an operation 704 in which scrubber 168a or 168b is cleaned by an agitated cleaning liquid. In some embodiments, scrubber 168a is moved into scrubber cleaning module 184a and cleaned by cleaning liquid 174 which is agitated by agitation generator 176. In some embodiments, scrubber 168b is moved into scrubber cleaning module 184b and cleaned by cleaning liquid 174 agitated by agitation generator 176a. In some other embodiments, scrubber 168a or 168b is moved into scrubber cleaning module 184c or 184d to be cleaned. After the cleaning of agitated cleaning liquid, scrubber 168a or 168b is ready for cleaning wafers.

Method 700A continues with an operation 706 in which one or more other wafers are cleaned by scrubber 168a or 168, which has been cleaned. As a result, one or more other wafers are sufficiently cleaned.

Figure 7B:
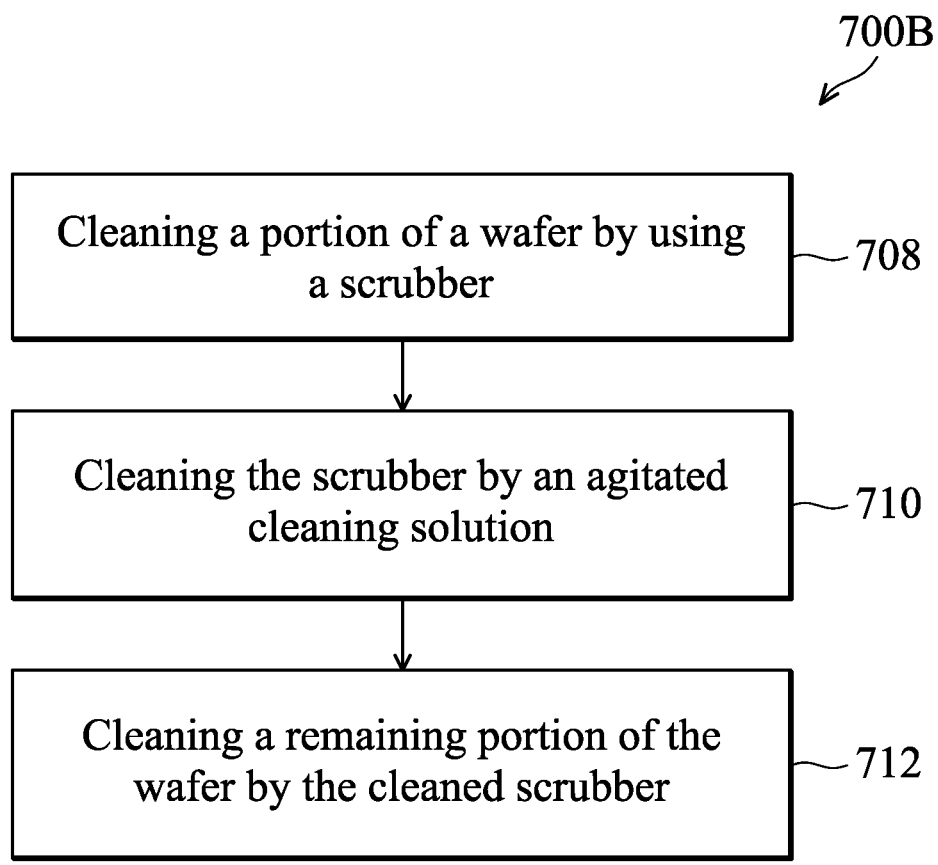

FIG. 7B is a flow chart illustrating a method 700B for cleaning a wafer, in accordance with some embodiments. Method 700B begins with an operation 708 in which a portion of a wafer is cleaned by using a scrubber, such as scrubber 168a. In some embodiments, because wafer 100 has a larger size, scrubber 168a may be contaminated to an unacceptable degree before wafer 100 is completely cleaned.

Figure 3B:
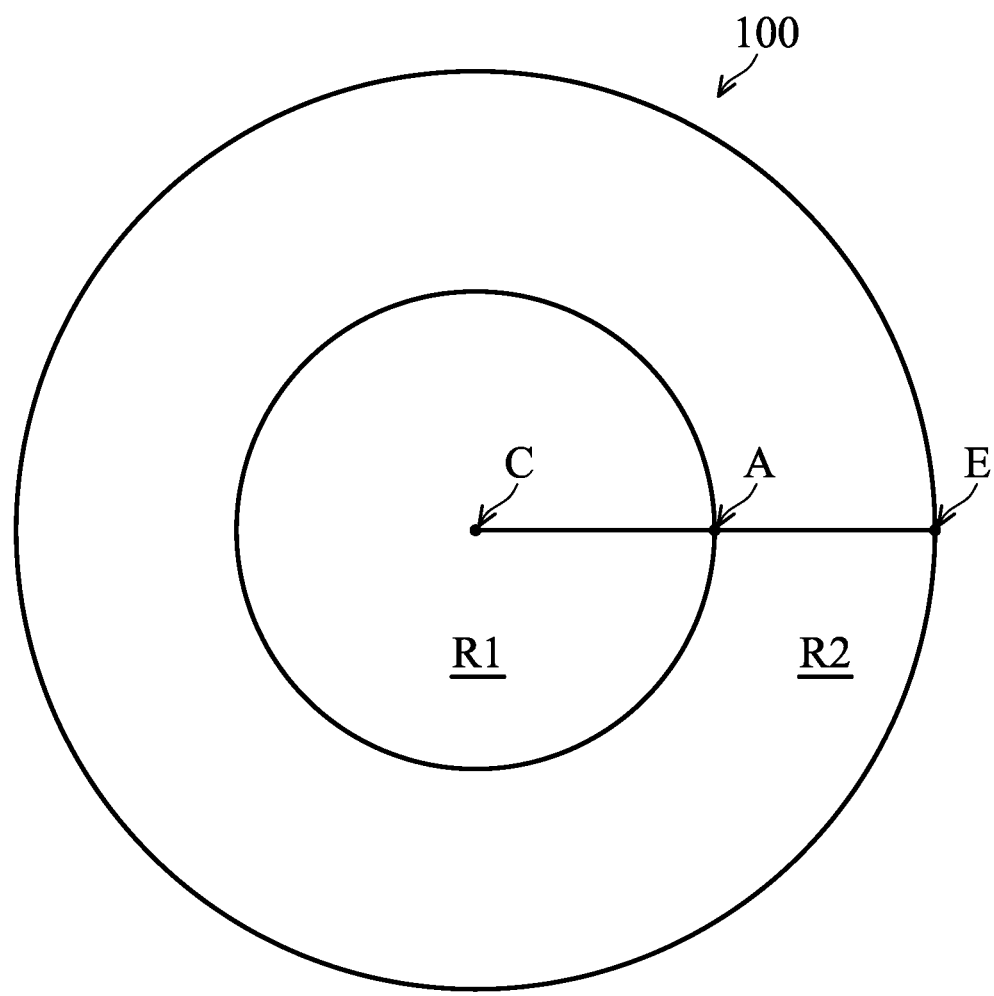
FIG. 3B is a top view of a wafer being cleaned, in accordance with some embodiments.

FIG. 3B is a top view of wafer 100 being cleaned, in accordance with some embodiments. Wafer 100 may have a larger size, such as having a diameter greater than about 18 inches or 22 inches. Referring to FIGS. 1A and 3B, scrubber 168a may be moved to be contact with center position C of wafer 100 and may be laterally and gradually moved towards edge position E of 100. In some embodiments, after a first region, such as region R1, is cleaned by scrubber 168a, scrubber 168a becomes too contaminated and needs to stop at a position, such as a position A between center position C and edge position E.

Method 700B continues with an operation 710 in which scrubber 168a is cleaned by an agitated cleaning liquid. In some embodiments, scrubber 168a is moved into scrubber cleaning module 184a, 184c, or 184d to be cleaned and agitation by cleaning liquid 174.

After scrubber 168a is cleaned, method 700B continues with an operation 712 in which a remaining portion of wafer 100 is cleaned by scrubber 168a which is cleaned. For example, region R2 is cleaned by cleaned scrubber 168a. Cleaning system 190 does not have to be shut off for replacement of a new scrubber. Therefore, wafer 100 is not needed to be moved from cleaning system 190. Wafer 100 is prevented from being contaminated during replacing a new scrubber.

Alternatively, scrubber 168a is used to clean wafer 100 from edge position E towards center position C and becomes too contaminated at a position, such as position A. The operation of scrubber 168a is temporarily stopped at position A. Scrubber 168a is sent to scrubber cleaning module 184a, 184c, or 184d to be cleaned and agitated by cleaning liquid 174. Scrubber 168a, which is cleaned, is moved back to finish the cleaning of region R1 of wafer 100.

As shown in FIG. 1A, cleaning system 190 includes a controller 179, which is configured to control scrubber assembly 122, in accordance with some embodiments. Controller 179 records the location of position A where the operation of scrubber 168a is temporarily stopped. Thus, scrubber 184a may be moved back to position A to finish the cleaning of the remaining portion of wafer 100.

Figure 7C:
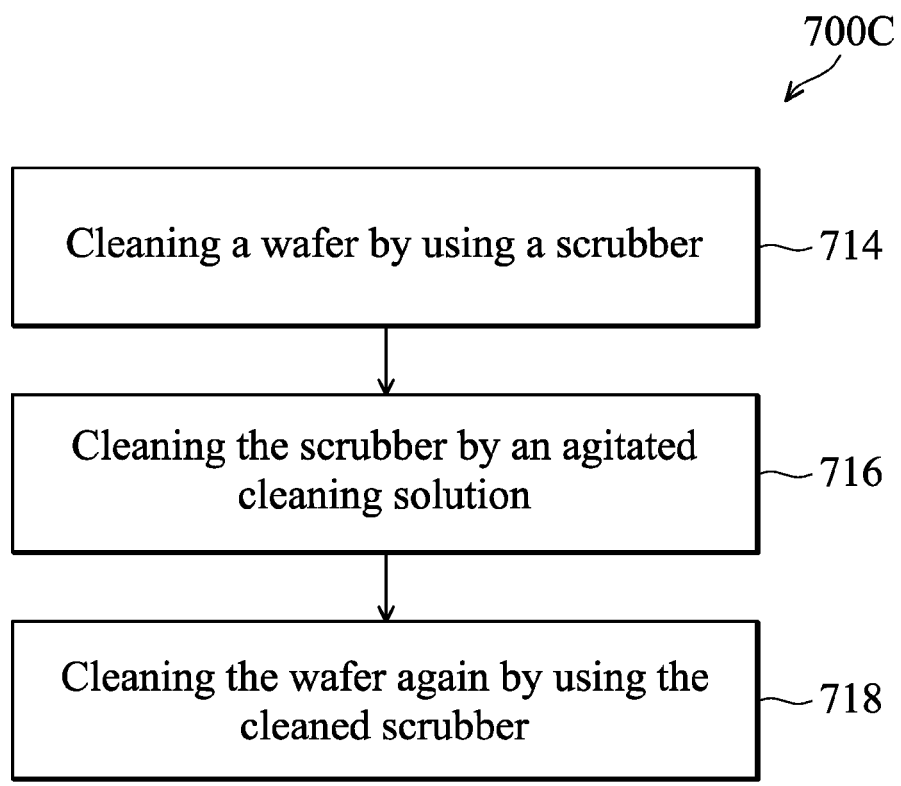

FIG. 7C is a flow chart illustrating a method 700C for cleaning a wafer, in accordance with some embodiments. Method 700C begins with an operation 714 in which wafer 100 is cleaned by using a scrubber, such as scrubber 168a or 168b.

Method 700C continues with an operation 716 in which scrubber 168a or 168b is cleaned by an agitated cleaning liquid. Scrubber 168a may be cleaned in scrubber cleaning module 184a, 184c, or 184d. Scrubber 168b may be cleaned in scrubber cleaning module 184b, 184c, or 184d. As a result, scrubber 168a or 168b is cleaned and ready for subsequent use.

Method 700C continues with an operation 718 in which wafer 100 is cleaned again by using cleaned scrubber 168a or 168b. Wafer 100 is cleaned again to ensure that substantially no particulate contaminant is fallen on wafer 100.

Embodiments of mechanisms for cleaning a scrubber described above apply an agitated cleaning liquid on the scrubber. Due to the assistance of the agitation energy, the scrubber is efficiently cleaned. Rotating, shaking, and/or swinging of the scrubber in the agitated cleaning liquid enhance the removal of particles accumulated on the scrubber. Fabrication time and cost are significantly reduced. Yield is greatly improved.

In accordance with some embodiments, a method for cleaning a wafer is provided. The method includes cleaning a wafer by using a wafer scrubber and cleaning the wafer scrubber in a scrubber cleaning module. An agitated cleaning liquid is applied on the wafer scrubber to clean the wafer scrubber. The method also includes cleaning the wafer or a second wafer by the wafer scrubber after the wafer scrubber is cleaned by the agitated cleaning liquid.

In accordance with some embodiments, a method for cleaning a wafer is provided. The method includes cleaning a portion of a wafer by using a wafer scrubber. The method also includes cleaning the wafer scrubber in a scrubber cleaning module, and an agitated cleaning liquid is applied on the wafer scrubber to clean the wafer scrubber. The method further includes cleaning a remaining portion of the wafer by the wafer scrubber after the wafer scrubber is cleaned by the agitated cleaning liquid.

In accordance with some embodiments, a system for cleaning a wafer is provided. The system includes a wafer cleaning module configured to clean a wafer and a scrubber cleaning module configured to clean a wafer scrubber used for cleaning the wafer. The scrubber cleaning module includes a cleaning liquid supply, and the cleaning liquid supply is configured to provide a cleaning liquid on the wafer scrubber. The scrubber cleaning module also includes an agitation generator, and the agitation generator is configured to agitate the cleaning liquid.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for cleaning a wafer, comprising:
   cleaning a wafer by using a wafer scrubber having a sloping sidewall;
   cleaning the wafer scrubber in a scrubber cleaning module, wherein an ultrasonically agitated cleaning liquid is applied on the sloping sidewall of the wafer scrubber to clean the wafer scrubber, and the wafer scrubber is at least partially dipped in a second ultrasonically agitated cleaning liquid;
   repeatedly raising and lowering the wafer scrubber and simultaneously rotating the wafer scrubber during applying the ultrasonically agitated cleaning liquid on the sloping sidewall of the wafer scrubber and at least partially dipping the wafer scrubber in the second ultrasonically agitated cleaning liquid;
   simultaneously swinging the wafer scrubber in the second ultrasonically agitated cleaning liquid during the repeatedly raising, lowering, and rotating of the wafer scrubber; and
   cleaning the wafer or a second wafer by the wafer scrubber after the wafer scrubber is cleaned by the ultrasonically agitated cleaning liquid and the second ultrasonically agitated cleaning liquid.

2. The method for cleaning a wafer as claimed in claim 1, wherein the operation of applying the ultrasonically agitated cleaning liquid on the sloping sidewall of the wafer scrubber is performed by ejecting the ultrasonically agitated cleaning liquid on the sloping sidewall of the wafer scrubber through an agitated nozzle.

3. The method for cleaning a wafer as claimed in claim 1, wherein the ultrasonically agitated cleaning liquid is ultrasonically agitated by an agitation generator.

4. The method for cleaning a wafer as claimed in claim 1, wherein the ultrasonically agitated cleaning liquid is made of deionized water, $NH_4OH$ solution, $H_2O_2$ solution, HCl solution, or combinations thereof.

5. The method for cleaning a wafer as claimed in claim 1, wherein a bottom surface and a portion of a second sloping sidewall of the wafer scrubber are dipped in the second ultrasonically agitated cleaning liquid.

6. The method for cleaning a wafer as claimed in claim 1, further comprising simultaneously rotating and shaking the wafer scrubber in the second ultrasonically agitated cleaning liquid.

7. The method for cleaning a wafer as claimed in claim 1, wherein the operation of cleaning the wafer comprises bringing the sloping sidewall of the wafer scrubber into contact with an edge of the wafer.

8. The method for cleaning a wafer as claimed in claim 1, wherein the wafer scrubber is swung at an angle in a range from about 30 degrees to about 90 degrees.

9. The method for cleaning a wafer as claimed in claim 1, wherein the ultrasonically agitated cleaning liquid is agitated at a frequency in a range from about 20 KHz to about 800 MHz.

10. A method for cleaning a wafer, comprising:
    cleaning a portion of a wafer by using a wafer scrubber;
    cleaning the wafer scrubber in a scrubber cleaning module, wherein an ultrasonically agitated cleaning liquid is applied on the wafer scrubber to clean the wafer scrubber, and a second ultrasonically agitated cleaning liquid is ejected on a sidewall of the wafer scrubber;
    repeatedly raising and lowering the wafer scrubber and simultaneously rotating the wafer scrubber during applying the ultrasonically agitated cleaning liquid on the wafer scrubber and ejecting the second ultrasonically agitated cleaning liquid on the sidewall of the wafer scrubber;
    simultaneously swinging the wafer scrubber in the second ultrasonically agitated cleaning liquid during the repeatedly raising, lowering, and rotating of the wafer scrubber; and
    cleaning a remaining portion of the wafer by the wafer scrubber after the wafer scrubber is cleaned by the ultrasonically agitated cleaning liquid and the second ultrasonically cleaning liquid.

11. The method for cleaning a wafer as claimed in claim 10, wherein a diameter of the wafer is greater than about 18 inches.

12. The method for cleaning a wafer as claimed in claim 10, wherein the operation of applying the ultrasonically agitated cleaning liquid on the wafer scrubber comprises dipping the wafer scrubber into the ultrasonically agitated cleaning liquid.

13. The method for cleaning a wafer as claimed in claim 10, wherein the second ultrasonically agitated cleaning liquid is ejected from an ultrasonically agitated nozzle.

14. The method for cleaning a wafer as claimed in claim 10, further comprising swinging the wafer scrubber in the ultrasonically agitated cleaning liquid.

15. The method for cleaning a wafer as claimed in claim 10, further comprising simultaneously rotating and shaking the wafer scrubber in the ultrasonically agitated cleaning liquid.

16. The method for cleaning a wafer as claimed in claim 10, wherein the ultrasonically agitated cleaning liquid is made of deionized water, $NH_4OH$ solution, $H_2O_2$ solution, HCl solution, or combinations thereof.

17. The method for cleaning a wafer as claimed in claim 10, wherein the operation of cleaning the portion of the wafer by using the wafer scrubber comprises moving the wafer scrubber from a center position of the wafer towards an edge position of the wafer or from the edge position towards the center position.

18. The method for cleaning a wafer as claimed in claim 17, wherein the operation of cleaning the portion of the wafer by using the wafer scrubber further comprises stopping the wafer scrubber at a position between the center position and the edge position, and recording the position.

19. The method for cleaning a wafer as claimed in claim 18, wherein the operation of cleaning the remaining portion of the wafer comprises moving the wafer scrubber from the position towards the edge position or the center position.

20. A method for cleaning a wafer, comprising:
cleaning a wafer by using a wafer scrubber;
cleaning the wafer scrubber in a scrubber cleaning module, wherein an ultrasonically agitated cleaning liquid is applied on the wafer scrubber to clean the wafer scrubber, and the wafer scrubber is at least partially dipped in a second ultrasonically agitated cleaning liquid;
repeatedly raising and lowering the wafer scrubber and simultaneously rotating the wafer scrubber during applying the ultrasonically agitated cleaning liquid on the wafer scrubber and at least partially dipping the wafer scrubber in the second ultrasonically agitated cleaning liquid;
simultaneously swinging the wafer scrubber in the second ultrasonically agitated cleaning liquid during the repeatedly raising, lowering, and rotating of the wafer scrubber; and
cleaning the wafer or a second wafer by the wafer scrubber after the wafer scrubber is cleaned by the ultrasonically agitated cleaning liquid and the second ultrasonically agitated cleaning liquid.

* * * * *